(12) United States Patent
Besser et al.

(10) Patent No.: US 6,660,621 B1
(45) Date of Patent: *Dec. 9, 2003

(54) METHOD OF FORMING ULTRA-SHALLOW JUNCTIONS IN A SEMICONDUCTOR WAFER WITH SILICON LAYER DEPOSITED FROM A GAS PRECURSOR TO REDUCE SILICON CONSUMPTION DURING SALICIDATION

(75) Inventors: Paul R. Besser, Sunnyvale, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/163,461

(22) Filed: Jun. 7, 2002

(51) Int. Cl.[7] .......................................... H01L 21/3205
(52) U.S. Cl. ..................... 438/592; 438/303; 438/595; 438/652; 438/655; 438/682; 438/683
(58) Field of Search .............................. 438/197, 230, 438/299, 300, 303, 306, 592, 595, 652, 655, 657, 682, 683

(56) References Cited

U.S. PATENT DOCUMENTS 6,165,903 A * 12/2000 Besser et al. ............... 438/682

OTHER PUBLICATIONS

*A self-aligned silicide process for thin silicon–on–insulator MOSFETs and bulk MOSFETs with shallow junctions*, IBM T.J. Watson Research Center, Yorktown Heights, NY 10598. (a manuscript submitted for publication to Materials REsearch Society 2001).

* cited by examiner

Primary Examiner—Jack Chen

(57) ABSTRACT

A method of forming ultra-shallow junctions in a semiconductor wafer forms the gate and source/drain junctions having upper surfaces at first metal suicide regions on the gate and source/drain junctions. These first metal silicide regions have a higher resistivity. Amorphous silicon is deposited on the first metal suicide regions by plasma enhanced chemical vapor deposition (PECVD). The PECVD process may be a lower pressure deposition process, performed at multiple stations to form the amorphous silicon layer in multiple layers. This creates a more uniform amorphous silicon layer across the wafer and different patterning densities, thereby improving device performance and characteristics. Annealing is then performed to form second metal silicide regions of a lower resistivity, by diffusion reaction of the first metal silicide regions and the amorphous silicon that was deposited by the PECVD process.

13 Claims, 3 Drawing Sheets

METHOD OF FORMING ULTRA-SHALLOW JUNCTIONS IN A SEMICONDUCTOR WAFER WITH SILICON LAYER DEPOSITED FROM A GAS PRECURSOR TO REDUCE SILICON CONSUMPTION DURING SALICIDATION

FIELD OF THE INVENTION

The present invention relates to the field of semiconductor device manufacturing, and more particularly, to the formation of low resistivity self-aligned silicide regions on the gate and source/drain junctions.

BACKGROUND OF THE INVENTION

There is currently a desire to evaluate the use of selective epitaxial silicon in the manufacturing of semiconductor devices. The need for this technology is the "roadmap" for silicon thickness on silicon-on-insulator (SOI) and the desire for faster parts on bulk silicon. The SOI roadmap suggests that the silicon thickness may be reduced to less than 500 Å in the near future. Assuming that each Angstrom of deposited cobalt (Co) in a conventional salicide process consumes approximately 3.5 Å of silicon from the substrate, a silicon thickness of 500 Å will be mostly consumed by the deposition and reaction of 100–130 Å of Co. Hence, the entirety and even the majority consumption of the silicon will deteriorate the transistor performance significantly. In addition, it is widely accepted that the elevation of the source and drain (or the reduction of silicon consumption) during silicidation is desirable for improving transistor performance, of either bulk or SOI devices.

A major difficulty with elevated source/drain technology is the actual elevating of the source/drains. The process must be selective and uniform, both of which pose difficult challenges. Selectivity means that the silicon must be grown epitaxially upon exposed silicon areas (source and drain), while not depositing on the exposed oxide or nitride regions. In addition, the silicon must be of uniform thickness across the wafer and across areas of differing patterning density. These constraints make the implementation of selective epitaxial silicon difficult. There are additional challenges as well. The process for selective epitaxial silicon involves the in-situ cleaning at elevated temperatures and deposition of silicon from a very reactive precursor. The deposition is sensitive to the condition of the silicon onto which the epitaxial silicon is grown. Thus, any surface damage from reactive chemical etching and/or ion implantation could be catastrophic and a difficult variable to control in the manufacturing of thousands of wafers per week. This makes the implementation of such a technology in actual production very challenging.

There are alternatives to selective epitaxial silicon that are being investigated. Once such technique is described in "A Self-Aligned Silicide Process to Thin Silicon-On-Insulator MOSFETs and bulk MOSFETs with Shallow Junctions", a manuscript submitted for publication to Materials Research Society (2001), from the IBM T. J. Watson Research Center, Cohen et al. In this alternative technique, Cohen et al. describes the modification of the salicide process to include co-sputtering of silicon with cobalt. After the reaction of this cobalt with the exposed silicon substrate in a conventional salicide process, a layer of amorphous silicon (a-Si) is deposited onto the exposed salicide and reacted with the $Co_2Si$ during formation of $CoSi_2$. The source of silicon above the $Co_2Si$ helps reduce the silicon consumption from the substrate.

In U.S. Pat. No. 6,165,903, a method is described for forming ultra-shallow junctions in a semiconductor wafer with reduced silicon consumption during salicidation by supplying additional silicon during a salicidation process. After the gate and source/drain junctions are formed in a semiconductor device, high resistivity metal silicide regions are formed on the gate and source/drain junctions. Silicon is then deposited in a layer on the high resistivity metal silicide regions. An annealing step is then performed to form low resistivity metal silicide regions on the gate and source/drain junctions. The deposited silicon is a source of silicon that is employed as a diffusion species during the transformation of the high resistivity metal silicide to a low resistivity metal silicide. Since the additional silicon provided in the deposited layer is consumed, there is reduced consumption of the silicon from the ultra-shallow junctions, thereby preventing the bottom of the silicide regions from reaching the bottom of the source/drain junctions.

Although the technique described in U.S. Pat. No. 6,165,903 may be considered a viable alternative to the process of selective epitaxial silicon on production wafers, improvements to the process are desirable in order to produce higher quality devices with reduced expenditures and with higher throughput. This would make the process even more commercially viable.

SUMMARY OF THE INVENTION

This and other needs are met by embodiments of the present invention which provide a method of forming ultra-shallow junctions in a semiconductor wafer, comprising the steps of forming gate and source/drain junctions having upper surfaces. First metal silicide regions are formed on the gate and source/drain junctions. These first metal suicide regions have a first resistivity. Amorphous silicon is deposited on the first metal silicide regions by plasma enhanced chemical vapor deposition (PECVD). Annealing is performed to form the second metal silicide regions with a second resistivity, lower than the first resistivity, by diffusion reaction of the first metal silicide region and the amorphous silicon.

The deposition of silicon by plasma enhanced vapor deposition (PECVD) provides a better uniformity than the PVD deposition processes, used in conventional technologies. The better uniformity of the amorphous silicon layer improves the device characteristics in performance of the product utilizing this technology. For example, the present invention provides a better uniform thickness across the wafers and across areas of differing patterning density.

In certain embodiments of the invention, the PECVD is performed at very low pressure with multiple layer deposition steps, utilizing multiple deposition stations.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of ultra-shallow Junctions by reducing the amount of silicon consumption during salicidation. The invention improves upon prior methodology by providing an amorphous-silicon layer that has better uniformity across the wafers and across areas of differing patterning density. This achieved, in part, by the deposition of an amorphous-silicon layer on high resistivity metal silicide regions using a PECVD process at a low pressure. The amorphous-silicon provided by the PECVD process acts as a source of silicon for diffusion during the reaction and the transformation of the high resistivity metal silicide regions to lower resistivity metal silicide regions. The reduction in silicon consumption in the source/drain junctions allows the junctions to be made shallower while avoiding junction leakage concerns. The better uniformity of the amorphous silicon layer improves the device characteristics and performance of the product utilizing this technology.

Figure 1:
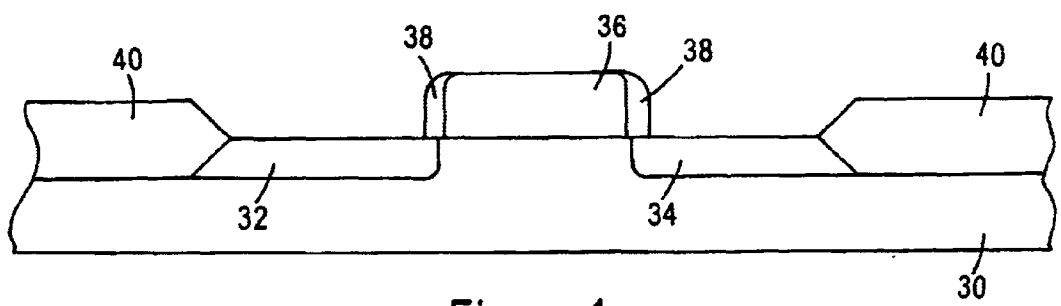
FIG. 1 is a cross-section of a portion of a semiconductor wafer prior to a salicidation process in accordance with certain embodiments of the present invention.

FIG. 1 is a cross-section of a semiconductor device on a semiconductor wafer on which low resistivity metal silicide regions will be formed in accordance with embodiments of the present invention. As with conventional semiconductor devices, a source junction 32 and a drain junction 34 are formed within a silicon substrate 30. A gate etch has produced a gate 36. Oxide (or nitride) spacers 38 are provided on the sides of the polysilicon gate electrode 36. Oxide isolation (such as LOCOS) regions 40 isolate individual semiconductor devices from each other.

Figure 2:
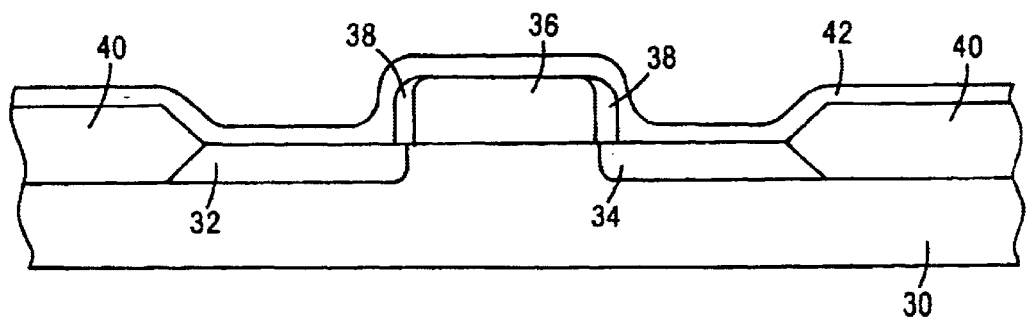
FIG. 2 is a depiction of the semiconductor device of FIG. 1, following the application of a metal layer, such as cobalt, in accordance with certain embodiments of the present invention.

As seen in FIG. 2, a layer of refractory metal 42 is then deposited uniformly across the entire wafer, preferably using physical vapor deposition from an ultra-pure sputtering target and a commercially available ultra-high-vacuum, multi-chamber, DC magnetron sputtering system. In certain preferred embodiments, the metal is cobalt (Co). Cobalt has a number of advantages over other types of metals. For example, in comparison to silicon, titanium silicide sheet resistance rises dramatically due to narrow-line effects. Since the low resistivity phase of cobalt silicide forms by a diffusion reaction rather than nucleation-and-growth as in the low resistivity phase of titanium silicide, cobalt silicide has been introduced by several integrated circuit manufacturers as the replacement for titanium. However, the use of cobalt in layer 42 as a refractory metal is exemplary only.

Figure 3:
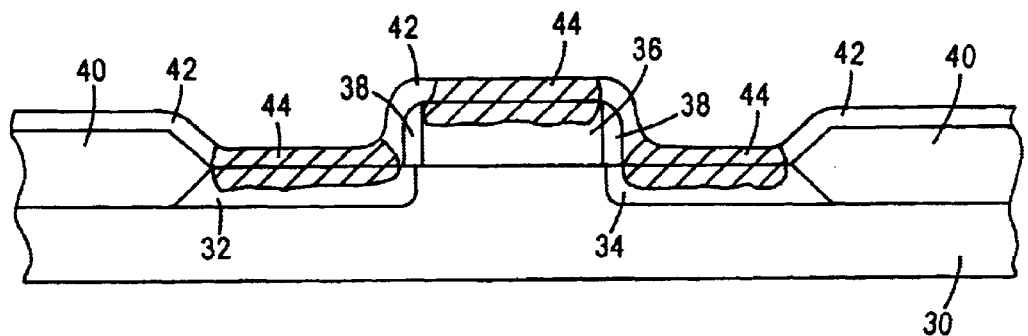
FIG. 3 depicts the semiconductor device of FIG. 2 following a first rapid thermal anneal step to form high resistivity metal silicide regions in accordance with embodiments of the present invention.

FIG. 3 depicts the semiconductor device of FIG. 2 after the formation of high resistivity metal silicide regions. In certain preferred embodiments, the high resistivity metal suicide regions 44 are created by a rapid thermal anneal step. The high resistivity metal silicide regions 44 may be made of cobalt suicide (CoSi), for example. The first rapid thermal annealing step may be performed by exposing the semiconductor wafer to a temperature between about 450° C. and about 600° C., and most preferably 500° C. The semiconductor wafer will be exposed for a relatively short time, for example, between about 5 and 90 seconds. As is apparent from FIG. 3, some of the silicon in the source and drain junctions 32, 34 is consumed during the first rapid thermal annealing step to become part of the high resistivity metal silicide regions 44. This is true also for the silicon in the polysilicon gate 36. At this point, a second thermal annealing step performed immediately in accordance with the prior art could cause excessive silicon consumption and the silicide to reach the-bottom of the source or drain junctions 32, 24, leading to junction leakage. As will be further described, the present invention avoids this concern by supplying silicon for consumption during the second rapid annealing step.

Figure 4:
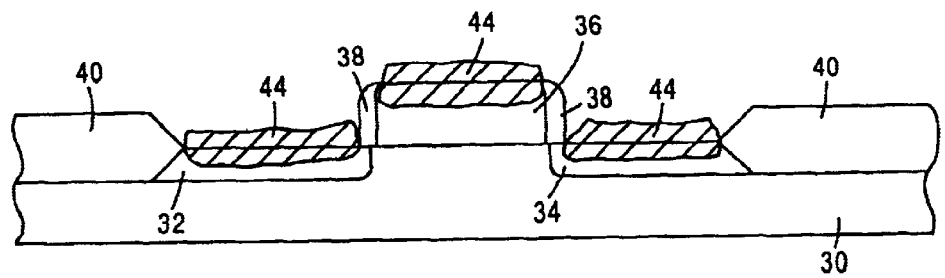
FIG. 4 depicts the semiconductor device of FIG. 3 following a selective etch that removes unreacted metal in accordance with embodiments of the present invention.

Prior to the supplying of additional silicon, a selective etch is performed to remove any unreacted refractory metal, such as cobalt. A typical etchant employed to remove unreacted cobalt is $3HCl:H_2O_2$. Removal of the unreacted metal by the peroxide solution leaves the silicide regions 44 intact. The resultant structure is depicted in FIG. 4.

Figure 5:
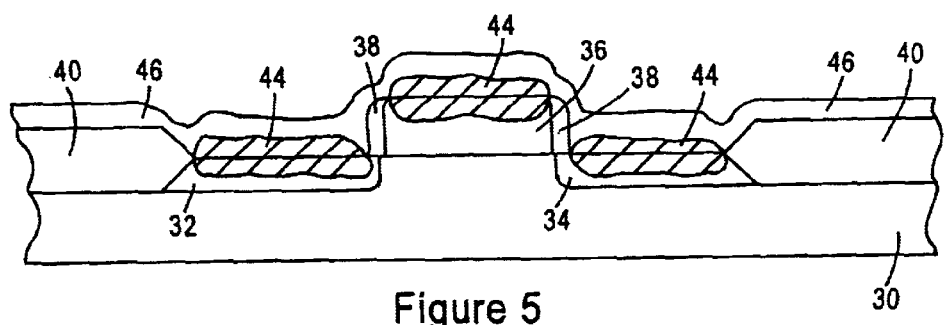
FIG. 5 is a depiction of the semiconductor device of FIG. 4 after blanket deposition of a silicon layer, in accordance of embodiments of the present invention.

Following the removal of any unreacted metal, the additional silicon is then provided by a blanket deposition of silicon over the areas of the semiconductor device, as shown in FIG. 5. The silicon layer 46 that has been deposited therefore covers the oxide isolation 40, the spacers 38, and the high resistivity metal silicide (e.g. CoSi) regions 44. The silicon layer may be deposited to a thickness between about 50 Å and 1000 Å, and preferably to a thickness of about 300 Å. Stated alternatively, although it can vary greatly, an exemplary ratio of the thickness of the deposited silicon to the thickness of the high resistivity metal silicide regions 44 is about 1.5:1.

Conventional technologies employ physical vapor deposition sputtering methods to deposit the thin silicon layer 46, or low temperature chemical vapor deposition methods, with the preferred methods employing PVD deposition. The present invention, however, provides for greater uniformity in the amorphous silicon layer 46 by employing a plasma enhanced chemical vapor deposition (PECVD) deposition process. The better uniformity that is provided by the PECVD process of the amorphous silicon improves the device characteristics and performance of the product utilizing this technology. The better uniform thickness is achieved across the wafers and across areas of differing patterning density.

In embodiments of the invention, the PECVD deposition process is performed at multiple stations to create multiple layer deposition. For purposes of illustration, a multiple layer deposition is depicted only as a single layer deposition in FIG. 5. However, in certain embodiments of the invention, the deposition is performed at multiple stations to create multiple silicon layers 46. In other embodiments, the PECVD deposition is performed at a single station to create a single silicon layer 46. Both of these different types of embodiments are represented by the deposition of the silicon layer 46 depicted in FIG. 5.

In certain embodiments of the present invention, the PECVD process is performed by depositing silicon from a silane ($SiH_4$) gas. In such embodiments, exemplary process parameters include the providing of silane to a PECVD processing chamber (not illustrated) at flow rate of between 100 to about 1000 sccm, and helium (He) at between about 250 to about 3000 sccm. The RF power of the PECVD processing tool is controlled to be between about 200 to about 1000 w. In embodiments of the invention, the pressure is maintained below about 1.8 torr and preferred embodiments in the invention, between about 0.7 to about 1.8 torr at 420 to about 460° C.

In certain embodiments of the invention, nitrogen ($N_2$) replaces the helium, and is provided to the PECVD processing chamber at a flow rate of between about 200 to about 2000 sccm.

The above parameters are exemplary only, as those of ordinary skill in the art may use other process parameters given the description of the invention provided herein.

The silicon provided in the deposited silicon layer 46 supplies silicon for the transformation of the high resistivity metal suicide regions to low resistivity metal silicide regions. This transformati2on is a diffusion process, and silicon is the diffusing species during the reaction. By depositing silicon on the surface, less silicon will be consumed from the junction areas 32, 34 as the low resistivity metal silicide regions are formed.

Figure 6:
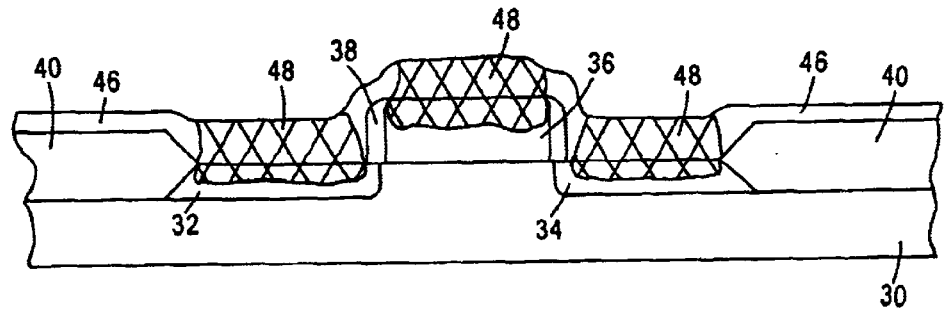
FIG. 6 is a depiction of the semiconductor device of FIG. 5 after a second rapid thermal annealing is performed to form lower resistivity metal silicide regions, in accordance with embodiments of the present invention.

Following the deposition of the silicon layer 46, as depicted in FIG. 5, a second rapid thermal anneal step is performed to produce lower resistivity metal silicide regions 48, as depicted in FIG. 6. This second rapid thermal anneal step exposes the semiconductor wafer to a higher temperature than employed in the first rapid thermal anneal step is between about 600° C. and 850° C., and preferably is 800° C. The semiconductor wafer is exposed to the high temperature for between about 5 and about 90 seconds.

As silicon is the diffusing species in the reaction, such as the transformation of the high resistivity phase of cobalt silicide (CoSi) to the low resistivity phase ($CoSi_2$), silicon from the silicon layer 46 is consumed. However, the silicon in the source/drain junction 32, 34 will not be excessively consumed since the silicon layer 46 supplies additional silicon for the monosilicide to silicide transformation. The low resistivity metal silicide regions 48, as depicted in FIG. 6, do not reach the bottom of the source/drain junctions 32, 34. Hence, the junction leakage problem is avoided with the embodiments of the present invention.

Figure 7:
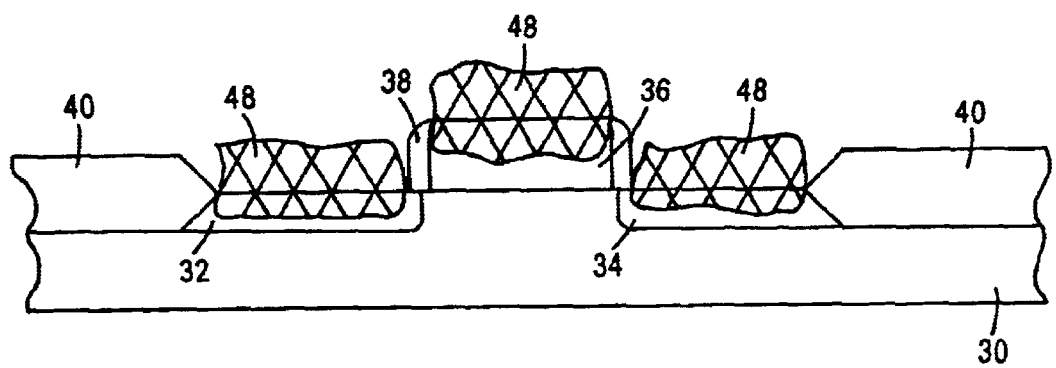
FIG. 7 depicts the semiconductor device of FIG. 6 following removal of unreacted silicon, in accordance with certain embodiments of the present invention.

In certain instances, the unreacted silicon in silicon layer 46 may be left in place. However, in certain cases, the unreacted silicon and silicon layer 46 will produce bridging across the spacer 40. In such cases, the unreacted silicon 46 needs to be stripped from the wafer surface to prevent the bridging across spacer 40. FIG. 7 depicts the semiconductor device of FIG. 6 after the unreacted silicon 46 has been stripped for these cases. The unreacted silicon is stripped by a selective etching process.

The embodiments of the present invention allow ultra-shallow junctions to be formed and employed in a semiconductor device with a low resistivity metal silicide, such as cobalt ($CoSi_2$), while avoiding junction leakage due to excessive silicon consumption during the salicidation process. This permits faster devices and better performance of the semiconductor device. An exemplary embodiment has been described in which cobalt is employed as the refractory metal in forming the silicide. However, the present invention finds utility in other applications employing other materials in which a monosilicide is transformed to a disilicide, where silicon is the diffusing species.

With the embodiments of the present invention, improved device characteristics and performance of the product is provided by employing a deposited amorphous silicon layer that has been deposited using a PECVD process. In accordance with certain embodiments of the invention, the PECVD process is performed as a multiple layer deposition, at multiple stations, at a lower pressure. This provides an amorphous silicon layer that exhibits better uniform thickness across the wafer and across areas of differing patterning densities.

Only certain preferred embodiments of the present invention and but a few examples of its versatility are shown and described in the present disclosure. It is to be understood that the present invention is capable of using various other combinations and environments is capable of changes and modifications within the scope of the invention concept has expressed herein.

What is claimed is:

1. A method of forming ultra-shallow junctions in a semiconductor wafer, comprising the steps of:

forming a gate and source/drain junctions having upper surfaces;

forming first metal silicide regions on the gate and source/drain junctions, the first metal suicide regions having a first resistivity;

depositing amorphous silicon (a-Si) on the first metal silicide regions by plasma enhanced chemical vapor deposition (PECVD); and annealing to form second metal silicide regions with a second resistivity, lower than the first resistivity, by diffusion reaction of the first metal silicide regions and the a-Si.

2. The method of claim 1, wherein the step of depositing a-Si includes depositing the a-Si in multiple layers at multiple deposition stations.

3. The method of claim 2, wherein the step of depositing a-Si includes providing silane to a PECVD processing chamber at a flow rate of between about 100 to about 1000 sccm.

4. The method of claim 3, wherein the step of depositing a-Si includes providing He to the PECVD processing chamber at a flow rate of between about 250 to about 3000 sccm.

5. The method of claim 3, wherein the step of depositing a-Si includes controlling RF power to between about 200 to about 1000 w.

6. The method of claim 3, wherein the step of depositing a-Si includes controlling pressure in the PECVD processing chamber to between about 0.7 to about 1.8 torr.

7. The method of claim 3, wherein the step of depositing a-Si includes controlling temperature in the PECVD processing chamber to between about 420 to about 460° C.

8. The method of claim 3, wherein the step of depositing a-Si includes providing $N_2$ to the PECVD processing chamber at a flow rate of between about 200 to about 2000 sccm.

9. The method of claim 1, wherein the step of depositing a-Si includes: providing silane to a PECVD processing chamber at a flow rate of between about 100 to about 1000 sccm; controlling RF power to between about 200 to about 1000 w; controlling pressure in the PECVD processing chamber to between about 0.7 to about 1.8 torr; and controlling temperature in the PECVD processing chamber to between about 420 to about 460° C.

10. The method of claim 9, wherein the step of depositing a-Si includes providing He to the PTCV-D processing chamber at a flow rate of between about 250 to about 3000 sccm.

11. The method of claim 9, wherein the step of depositing a-Si includes providing $N_2$ to the PECVD processing chamber at a flow rate of between about 200 to about 2000 sccm.

12. The method of claim 9, wherein the second metal silicide regions comprise $CoSi_2$.

13. The method of claim 1, wherein the step of depositing a-Si includes controlling pressure in a PECVD processing chamber to below about 1.8 torr at between about 420 to about 460° C.

* * * * *